(12) United States Patent  
Forte

(10) Patent No.: US 8,223,991 B2  
(45) Date of Patent: Jul. 17, 2012

(54) AMPLIFICATION CIRCUIT FOR DRIVING A DIFFUSER

(75) Inventor: Federico Forte, Novara (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 592 days.

(21) Appl. No.: 12/402,315

(22) Filed: Mar. 11, 2009

(65) Prior Publication Data

US 2009/0289704 A1    Nov. 26, 2009

(30) Foreign Application Priority Data

May 21, 2008    (IT) .............................. MI2008A00930

(51) Int. Cl.
*H04B 15/00* (2006.01)

(52) U.S. Cl. ......... 381/94.5; 381/94.1; 381/96; 381/111

(58) Field of Classification Search .................. 381/94.5, 381/94.1, 96, 111
See application file for complete search history.

(56) References Cited

U.S. PATENT DOCUMENTS

| 5,142,695 | A * | 8/1992 | Roberts et al. ................ 455/437 |
| 7,590,251 | B2 * | 9/2009 | Andersen et al. ............. 381/106 |
| 7,782,129 | B2 * | 8/2010 | Mallinson et al. .............. 330/10 |
| 2002/0011904 | A1 * | 1/2002 | Mellot ........................... 332/117 |
| 2007/0279101 | A1 * | 12/2007 | Onodera et al. ................... 327/1 |
| 2008/0049952 | A1 * | 2/2008 | Jung et al. .................... 381/94.5 |
| 2009/0196435 | A1 * | 8/2009 | Miao ........................... 381/94.5 |

* cited by examiner

*Primary Examiner* — Howard Weiss  
*Assistant Examiner* — Tifney Skyles  
(74) *Attorney, Agent, or Firm* — Seed IP Law Group PLLC

(57) ABSTRACT

An amplification circuit for driving an audio signal diffuser that includes a generation circuit of a first pre-charging signal, the generation circuit including an amplifier provided with an input terminal for receiving the first pre-charging signal and provided with an output terminal for providing a second pre-charging signal as a function of the first pre-charging signal, and a decoupling capacitor of the amplifier from the diffuser, the capacitor connected to the output terminal for charging by the second pre-charging signal.

26 Claims, 8 Drawing Sheets

AMPLIFICATION CIRCUIT FOR DRIVING A DIFFUSER

BACKGROUND

1. Technical Field

The present disclosure generally relates to the audio signal amplification field and, more particularly, to an amplification circuit for driving an audio signal diffuser, such as, for example, a loudspeaker.

2. Description of the Related Art

Known audio amplifier systems generally include an audio signal source, an audio signal amplifier, a low-pass filter to remove frequencies higher than the audio band, and an audio signal diffuser (for example, a loudspeaker, headphones or earphones).

In particular, in such conventional systems, the signal of the voltage drop at the diffuser is biased to the zero value, enabling the diffuser to operate correctly and preventing damage to the diffuser.

This is achieved by using a decoupling capacitor connected between the terminal of the filtered audio signal and a terminal of the diffuser. Typical values of the capacitance of the capacitor are in the range from 100 μF to 220 μF, in order not to remove the audio frequencies (usually comprised between 20 Hz and 20 kHz).

The audio amplification system is supplied with a supply voltage V_alim and, afterwards, the audio amplification system is activated for diffusing an audio signal of an audio source (for example, a Compact Disk). Upon activation of the amplification system, the amplifier input starts being driven by an input audio signal (derived from the audio signal of the audio source), and the voltage signal at the amplifier output has an abrupt change from the zero value to a value greater than zero (for example an average value equal to half the supply voltage V_alim/2 of the audio amplification system 200). Initially, the decoupling capacitor is still discharged, and it starts charging slowly. The signal of the voltage drop at the diffuser undergoes an abrupt change from the zero value to a value greater than zero (in the example, an average value equal to half the supply voltage), which causes a noise generated by the diffuser, which is referred below to as "activation noise" (hereinafter referred to as "pop noise").

The decoupling capacitor is then charged in a certain time interval, when the average value of the signal of the voltage drop at the diffuser decreases to zero. When in the steady state, the decoupling capacitor is charged to the working voltage value and the average value of the biasing voltage drop at the diffuser is zero, such that the diffuser can operate properly.

Methods for reducing the pop noise are known, whose object is to reduce the abrupt change of the signal of the voltage drop at the diffuser. These methods provide (where the pop noise is present) the use of a pre-charge step of the decoupling capacitor at the working value before the amplifier starts driving the diffuser with the amplified audio signal.

In this way, when the amplifier starts driving the diffuser, the decoupling capacitor is already charged at the working value and the biasing voltage drop at the diffuser is zero even when the amplifier starts driving the diffuser, thereby reducing the pop noise.

A prior method for implementing the decoupling capacitor pre-charging step is to use a resistive voltage divider located between the filtered amplified signal and the decoupling capacitor, by which an increasing voltage signal is generated, stepwise used to charge the decoupling capacitor from the zero value to the working value, thereby reducing the pop noise.

The applicant has realized that a drawback of this prior method is that it requires too much time to charge the decoupling capacitor (in the order of seconds), because the capacitance has a high value (in order not to remove the audio frequencies) and this time is proportional to the capacitance. Moreover, it is difficult to make the voltage divider by using two identical resistances and thus there is the risk that the decoupling capacitor is not being charged exactly at the working value, resulting in a pop noise that is only partially reduced.

A further prior method for the pre-charge of the decoupling capacitor is described in U.S. Patent Application No. 2008/0049952-A1, according to which it is possible to use a dedicated circuit to generate a voltage signal with a slowly increasing linear pattern to charge the decoupling capacitor. The dedicated circuit includes a width modulator that generates a pulse signal having a constant frequency and constant pulse width and includes an integrator to generate the linearly increasing signal as a function of the signal generated by the width modulator. Alternatively, the circuit includes a density modulator that generates a pulse signal with a constant pulse density and includes the integrator.

The drawbacks of this prior method is that it requires a dedicated circuit for the pre-charge of the decoupling capacitor and it requires an integrator to generate the pre-charging signal. Moreover, the applicant has recognized that this prior method further has the drawback that it requires too much time to charge the decoupling capacitor, because the signal used to charge the capacitor increases slowly over the time.

BRIEF SUMMARY

The present disclosure relates to an amplification circuit.

In accordance with one embodiment of the present disclosure, an amplification circuit is provided for driving a diffuser of an audio signal, the circuit including a generation circuit of a first pre-charging signal; an amplifier having an input terminal for receiving the first pre-charging signal and an output terminal for providing a second pre-charging signal generated as a function of the first pre-charging signal; a decoupling capacitor of the amplifier from the diffuser, the capacitor connected to the output terminal of the amplifier to receive the second pre-charging signal.

In accordance with another aspect of the foregoing embodiment, the generation circuit includes a first generator of a pulse density modulated signal; a second generator of a pulse width modulated signal; a selector that selects between the pulse density modulated signal and the pulse width modulated signal; wherein the selector is adapted to select as a first pre-charging signal first the pulse density modulated signal and then the pulse width modulated signal.

In accordance with another aspect of the foregoing embodiment, the amplification circuit includes a converter that comprises an oversampler for receiving the first pulse code modulated signal and for providing therefrom a third oversampled pulse code modulated signal; an interpolator for receiving the third oversampled pulse code modulated signal and for providing therefrom a first sequence of quantized values indicating time instants of the second pulse width modulated signal; a noise shaper for receiving the first sequence of quantized values and for providing therefrom a second sequence of quantized values with a smaller number of bits and with a smaller noise in the frequency band of the first usable pulse code modulated signal.

In accordance with another embodiment of the present disclosure, a circuit for amplifying an audio signal for use with an audio output device is provided, the circuit including a decoupling capacitor coupled to an output of the circuit; a pre-charge generation circuit that generates on an output a pulse density modulated signal and a pulse width modulated signal in an alternating sequence as determined by a control signal received by a selection circuit in the pre-charge generation circuit; and an amplifier having an input coupled to the output of the pre-charged generation circuit and generating a pre-charge signal that is received by the decoupling capacitor for use in controlling the audio output device.

In accordance with another aspect of the foregoing embodiment, the circuit includes a ramp generator that generates a ramp signal used to generate the two modulation signals.

In accordance with another aspect of the foregoing embodiment, the circuit includes a converter having a converter circuit coupled to the pre-charge generation circuit and comprising a noise shaper circuit for providing a sequence of quantized values to the pre-charge generation circuit.

In accordance with another embodiment of the present disclosure, a circuit is provided that includes a generator circuit adapted to produce a ramp signal that is used to generate on an output of the generator circuit a first modulation signal and a second modulation signal in an alternating sequence as determined by a selector circuit that receives a control signal from a control circuit that receives the ramp signal, the generator circuit outputting the first modulation signal and the second modulation signal; a decoupling capacitor coupled to the generator circuit and adapted to receive the first modulation signal and the second modulation signal as a pre-charge signal; and an audio output device coupled to the decoupling capacitor.

In accordance with another aspect of the foregoing embodiment, the circuit includes an amplifier coupled between the generator circuit and the decoupling capacitor, the amplifier having an input coupled to the generator circuit to receive the first modulation signal and the second modulation signal and further comprising an output coupled to the decoupling capacitor on which is generated a pre-charged signal that is received by the decoupling capacitor.

In accordance with another aspect of the foregoing embodiment, the circuit includes a converter circuit coupled to the pre-charge generation circuit, the converter including a noise shaper circuit for providing a sequence of quantized values to the pre-charge generation circuit.

The applicant has recognized that the circuit according to the present disclosure can reduce the time required to charge the decoupling capacitor connected between an audio amplifier and an audio signal diffuser.

BRIEF DESCRIPTION OF THE SEVERAL VIEWS OF THE DRAWINGS

Further characteristics and the advantages of the present disclosure will result from the following description of a preferred embodiment and its variants, provided only by way of example, as illustrated in the accompanying drawings, wherein.

DETAILED DESCRIPTION

Figure 1:
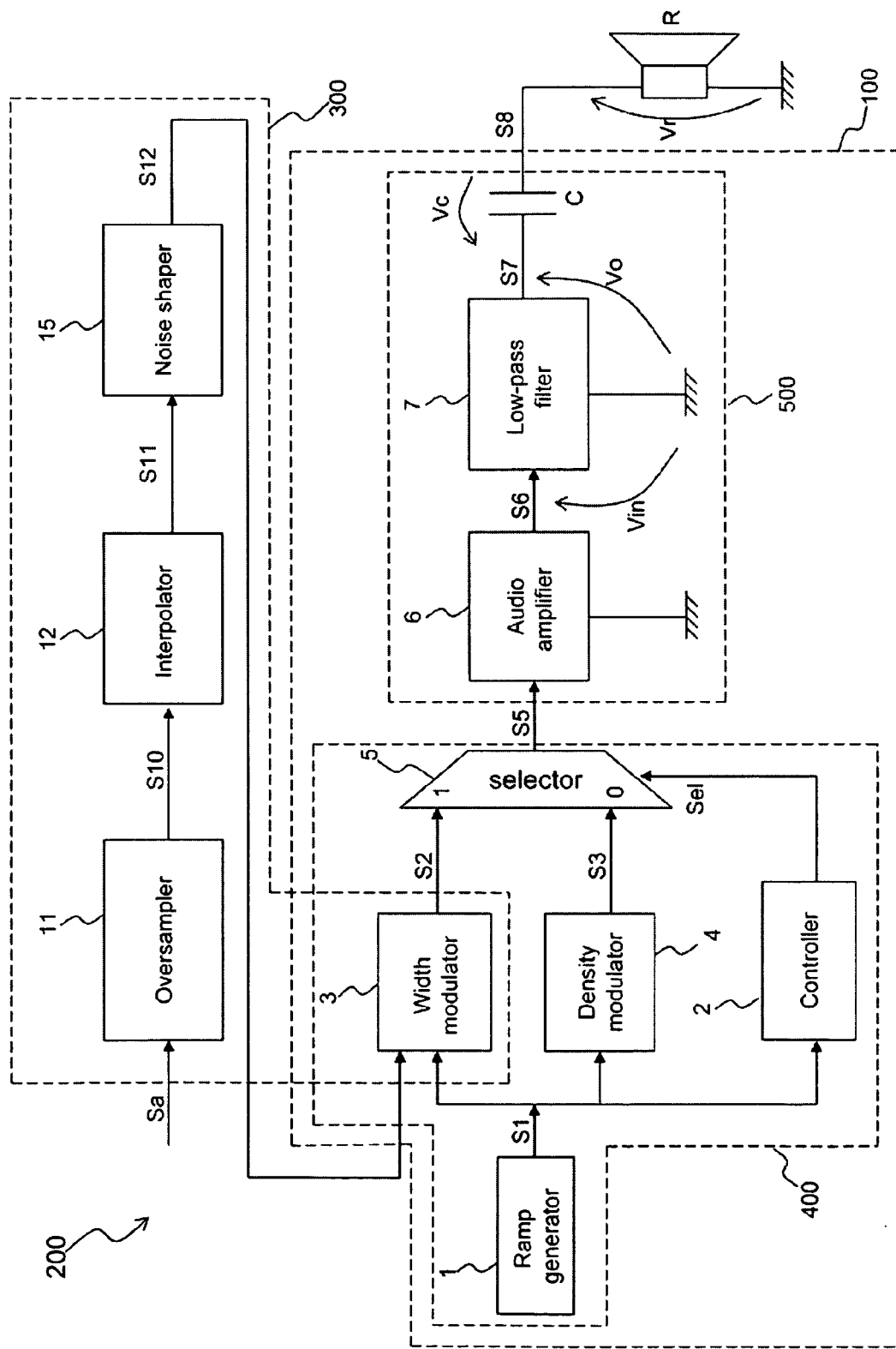
FIG. 1 schematically shows an amplification system according to a first embodiment of the present disclosure.

Referring to FIG. 1, an amplification system 200 is shown, including a converter 300, an amplification circuit 100 and a diffuser R.

It is stated that the decoupling capacitor C serves to bias the diffuser R to the zero value, in order to prevent the diffuser R itself from being damaged. Moreover, it is noted that the audio amplification circuit 200 is such that it operates in two steps: a pre-charging step and an amplification step. In the pre-charging step, the decoupling capacitor C is charged at a proper voltage value. In the amplification step, the diffuser R is driven in order to generate an audible sound signal corresponding to an input audio signal.

The converter 300 includes an oversampling module 11, an interpolator module 12, a noise shaping module 15 and a width modulator 3. Such a converter 300 serves to carry out an audio digital signal conversion with coded pulse modulation signal Sa, present at its own input in a pulse width modulated audio signal S2, as will further explained below.

The amplification circuit 100 includes a generation circuit 400 and an amplifier 500. The generation circuit 400 has a ramp generator 1, the width modulator 3 (common to the converter 300), a density modulator 4, a controller 2, and a selector 5.

The amplifier 500 includes an audio amplifier 6 and, advantageously, a low-pass filter 7 and a decoupling capacitor C.

Referring to the converter 300, the oversampling module 11 includes an input terminal to receive a N-bit quantized pulse code modulated audio digital signal Sa (hereafter referred to as PCM=Pulse Code Modulation) from a source (for example a compact disk) and it includes an output terminal to provide an oversampled signal S10. Preferably, the oversampling module 11 is such that it provides an oversampled signal S10 inserting zero value samples between two subsequent samples of the pulse code modulated audio digital signal Sa and digitally filtering the undesired spectral replicas generated by the insertion of zero value samples.

The interpolator module 12 has an input terminal in order to receive the oversampled signal S10 and includes an output terminal in order to provide a first sequence of quantized samples S11 indicating time instants of the pulse width modulated signal S2, as will be further explained below.

The noise shaping module 15 utilizes an input terminal to receive the first sequence S11 of quantized values and it comprises an output terminal to provide a second sequence of quantized samples S12 with a smaller number of bits M (than the number of bits N of the first sequence samples) and a smaller noise (than M bits-directly quantized sample sequence) in the frequency band of the pulse code modulated audio digital signal Sa. Therefore also the second sequence of quantized samples S12 indicates the time instants of the pulse width modulated signal S2.

Referring to the generation circuit 400, the ramp generator 1 has an output terminal on which it can make available a signal S1 having a ramp pattern increasing in a certain time interval required for the pre-charge of the output terminal C, as will be further explained below.

Figure 3:
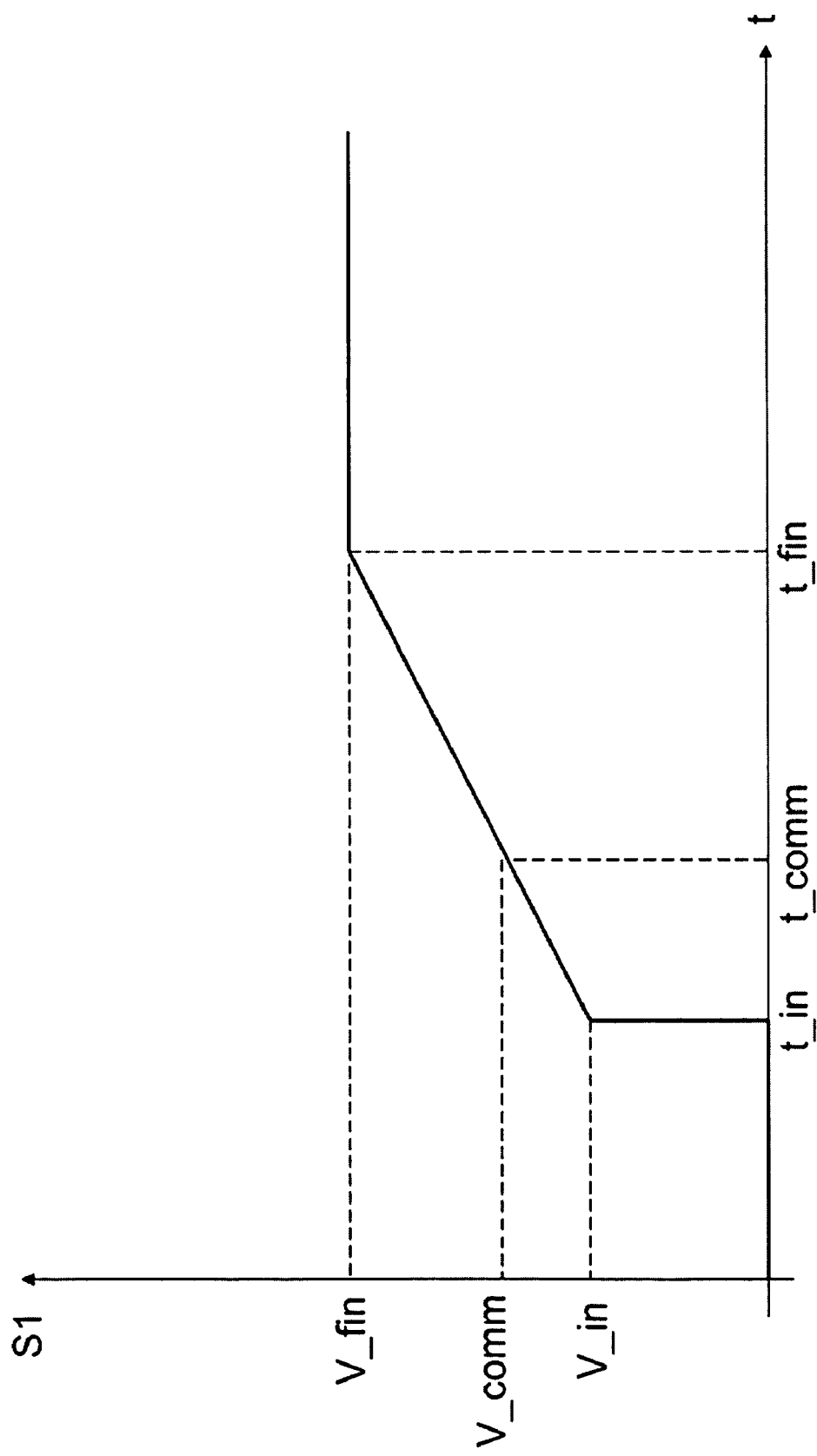
FIG. 3 schematically shows a possible pattern of the signal provided by a ramp generator of an amplification circuit used in the amplification system.

In particular, FIG. 3 shows an example of the pattern of the signal S1 that may be generated by the ramp generator 1. The ramp signal S1 has a ramp pattern linearly increasing from an initial value V_in to the final value V_fin in a time interval from the time instant t_in to t_fin, wherein t_in is the instant when the pre-charging step starts and t_fin is the instant when the pre-charging step ends (which coincides with the beginning of the driving of the audio amplifier input with an input audio signal derived from an audio signal of an audio source). However, the linearly increasing ramp pattern of the signal S1 is not essential. That is, a signal S1 generator may be used in order to have a stepwise increasing pattern according to other curve models that can be obtained (for example, a polynomial curve with a grade greater than the first or an exponential curve) in the time interval between the instants t_in and t_fin wherein the decoupling capacitor C pre-charging occurs.

The time instant t_fin is chosen in order to have a sufficiently short pre-charging step (for example, 100 ms in the case of an audio amplification system) and this is possible using the same audio amplifier to carry out the pre-charging, as will be further explained below.

Preferably, the ramp generator 1 is implemented with a digital counter, such that a quantized sample sequence with values in the range of −1 and 1 is generated.

The width modulator 3 (referred to in English as PWM=Pulse Width Modulator) includes a first input terminal in order to receive the second sequence S12 and a second input terminal in order to receive a ramp signal S1. It includes an output terminal in order to generate a pulse width modulated signal S2 as a function of the second sequence S12 or the ramp signal S1. In particular, the width modulator 3 is such that the signal S2 pulse frequency is fixed, whereas the width of the pulses themselves depends on the samples value of the second sequence S12 or on the value of the ramp signal S1.

The width modulator 3 has a first and a second operation mode. The first mode (between the instants t_comm and t_fin) is activated during the capacitor pre-charging step. The width modulator 3 is such that it generates (as a function of the ramp signal S1) an appropriate pulse width modulated signal S2 used for the capacitor pre-charging. In the normally operating second mode (following the t_fin) the width modulator 3 is such that it generates a pulse width modulated audio signal S2, where the pulse width is such that it depends on the samples value of the second sequence S12. Preferably, the width modulator 3 is such that it generates a square wave pulse signal S2, wherein the low value of the square wave is 0 and the high value of the square wave is 1.

Preferably, the width modulator 3 is implemented with a digital counter and a digital comparator, as will be further explained in detail below.

The density modulator 4 includes an input terminal in order to receive the ramp signal S1 and an output terminal to generate (as a function of the ramp signal S1) a density modulated pulse signal S3. In particular, the density modulator 4 is such that the pulse width is fixed, whereas the density of the pulses themselves is such that it depends on the value of the ramp signal S1. Preferably, the density modulator is such that it generates a square wave pulse signal S3, wherein the low value of the square wave is 0 and the high value of the square wave is 1.

Figure 2:
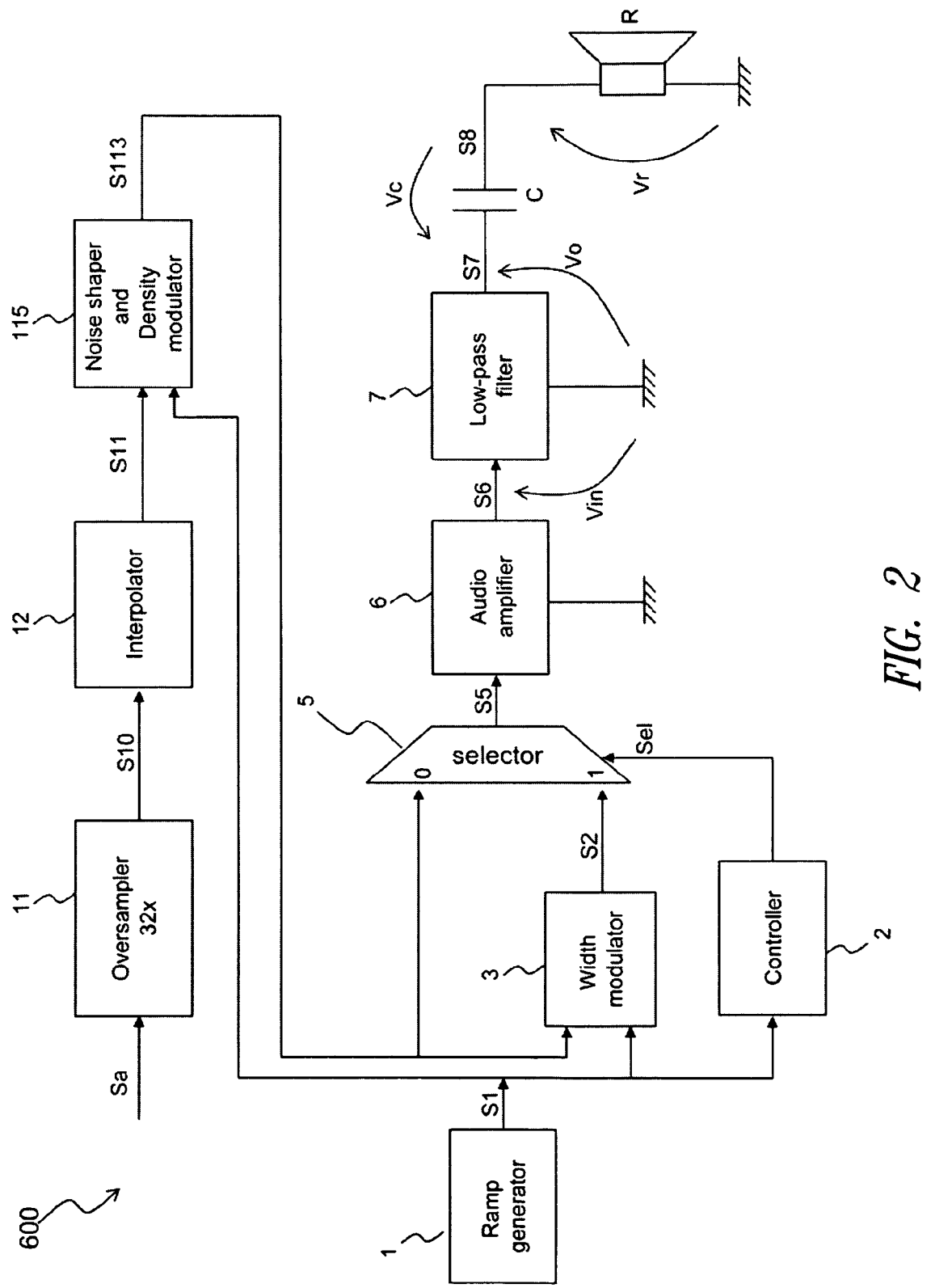
FIG. 2 schematically shows an amplification system according to a second embodiment of the present disclosure.

FIG. 2 shows a further audio amplification system 600 similar to 200 in FIG. 1, wherein, however, the density modulation is implemented not with the modulator 4 (which is omitted), but it is implemented with the noise shaping device 115, where the sampling period of the noise shaping device 115 is equal to the minimum pulse width.

According to this alternative embodiment of FIG. 2, the module 115 can operate as a noise shaper, when the amplification system 600 is adapted to receive a usable coded modulated pulse audio signal Sa and then to operate in the normal amplification step of the usable audio signal. Moreover, the module 115 implements the functionality of density modulator when the audio amplification system 600 is adapted to operate in a first part of the capacitor pre-charging step. It is noted that, in the present description, identical or similar blocks, components or module are indicated in the figures with the same reference numerals.

A further alternative embodiment (not shown in the figures) is similar to 600 in FIG. 2 wherein, however, the output terminal of the ramp generator 1 is connected to a second input terminal of the oversampler 11 (instead of being connected to the second input terminal of the module 115 and the second input terminal of the width modulator 3). According to this further alternative embodiment, the oversampler 11 thus includes a first and a second input terminal for receiving the audio digital signal Sa and the ramp signal S1, respectively. The oversampler 11 further includes an output terminal for providing the oversampled signal S10 as a function of the ramp signal S1 during the pre-charging step and for providing the oversampled signal as a function of the audio digital signal Sa during the normal amplification step.

According to this further alternative embodiment, the module 115 can operate as a noise shaper when the audio amplification system is adapted to operate in a second part of the capacitor pre-charging step and when the amplification system is adapted to receive a usable pulse code modulated audio signal Sa and hence to operate in the normal amplification step of the usable audio signal. Moreover, the module 115 implements the density modulator function when the audio amplification is adapted to operate in a first part of the capacitor pre-charging step.

Selector 5, in this case a multiplexer, includes a first input terminal to receive a pulse width modulated signal S2, a second input terminal to receive the density modulated pulse signal S3 and a selection input terminal for receiving a selection signal Sel. Moreover, the selector 5 is provided with an output terminal for providing (when the audio amplification system 200 is such that it operates in the pre-charging step) a first pre-charging signal S5 selected between the pulse width modulated signal S2 and the density modulated pulse signal S3 as a function of the value of the selection signal Sel. In the example of FIG. 1, the selector is such that it provides, on the output terminal, the pulse width modulated signal S2 when the logic value of the selection signal is '1' and the pulse modulated pulsed signal S3 when the logic value of the selection signal Sel is '0'.

Figure 4:
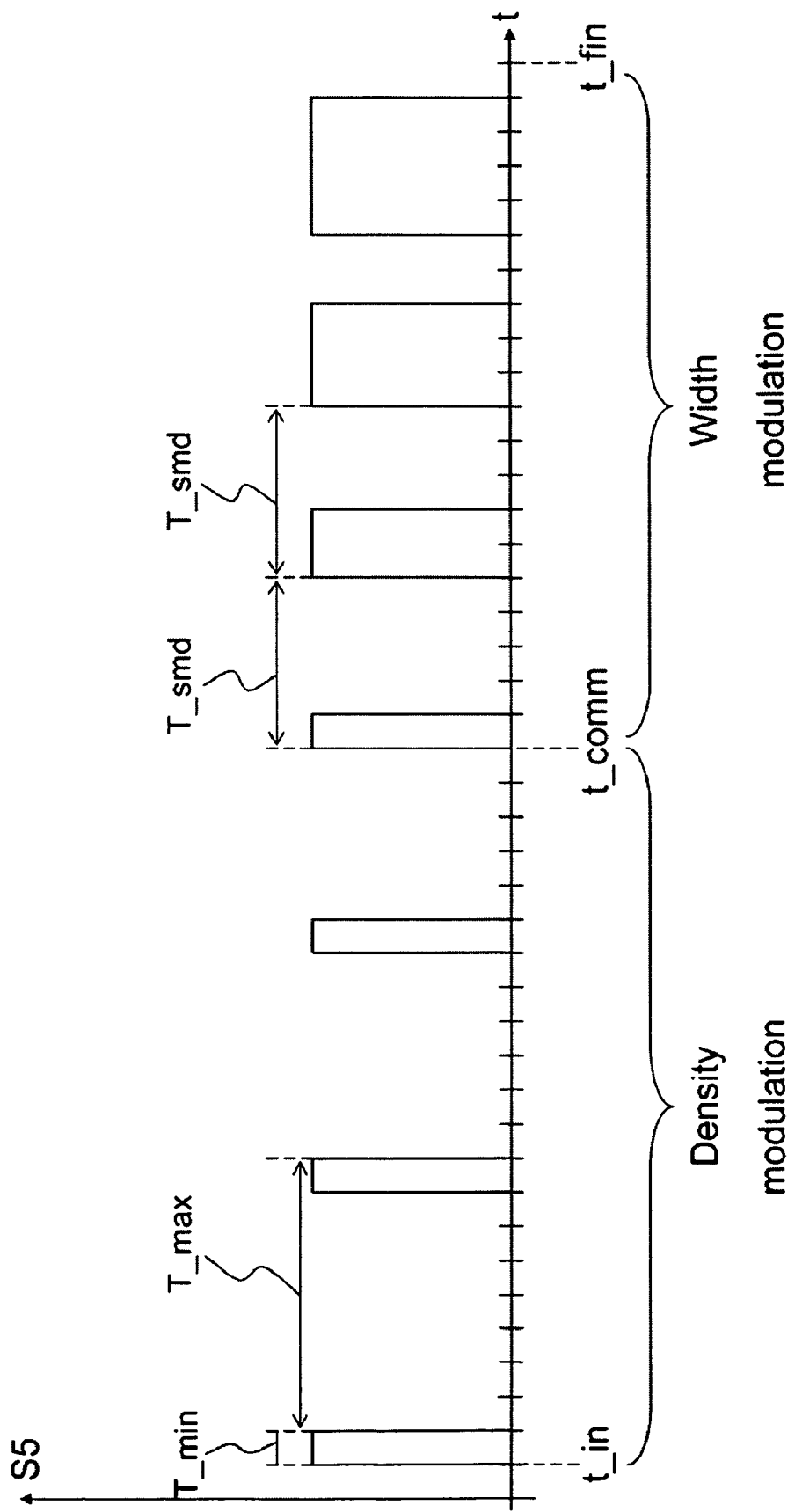
FIG. 4 schematically shows the pattern of the input signal at an amplifier used in the amplification circuit during a pre-charging step of the decoupling capacitor.

In particular, FIG. 4 shows the pattern of the first pre-charging signal S5 when the audio amplification system 200 is such that it operates in the pre-charging step, as will be further explained below.

The controller 2 includes an input terminal (not shown in FIGS. 1 and 2) to detect the activation of the audio amplification system 200 and to detect the value of the ramp signal S1. Moreover it includes an output terminal to drive the selection input of selector 5.

The audio amplifier 6 has an input terminal to receive (during the pre-charging step) the first pre-charging signal S5 and includes an output terminal to provide an amplified signal S6, which has a pulse pattern similar to the first pre-charging signal S5 and amplitude values greater or amplified in power; preferably, the amplified signal S6 is a square wave pulse signal, wherein the low value of the square wave is a zero voltage and the high value of the square wave is the supply voltage V_alim of the audio amplification system 200.

Figure 6:
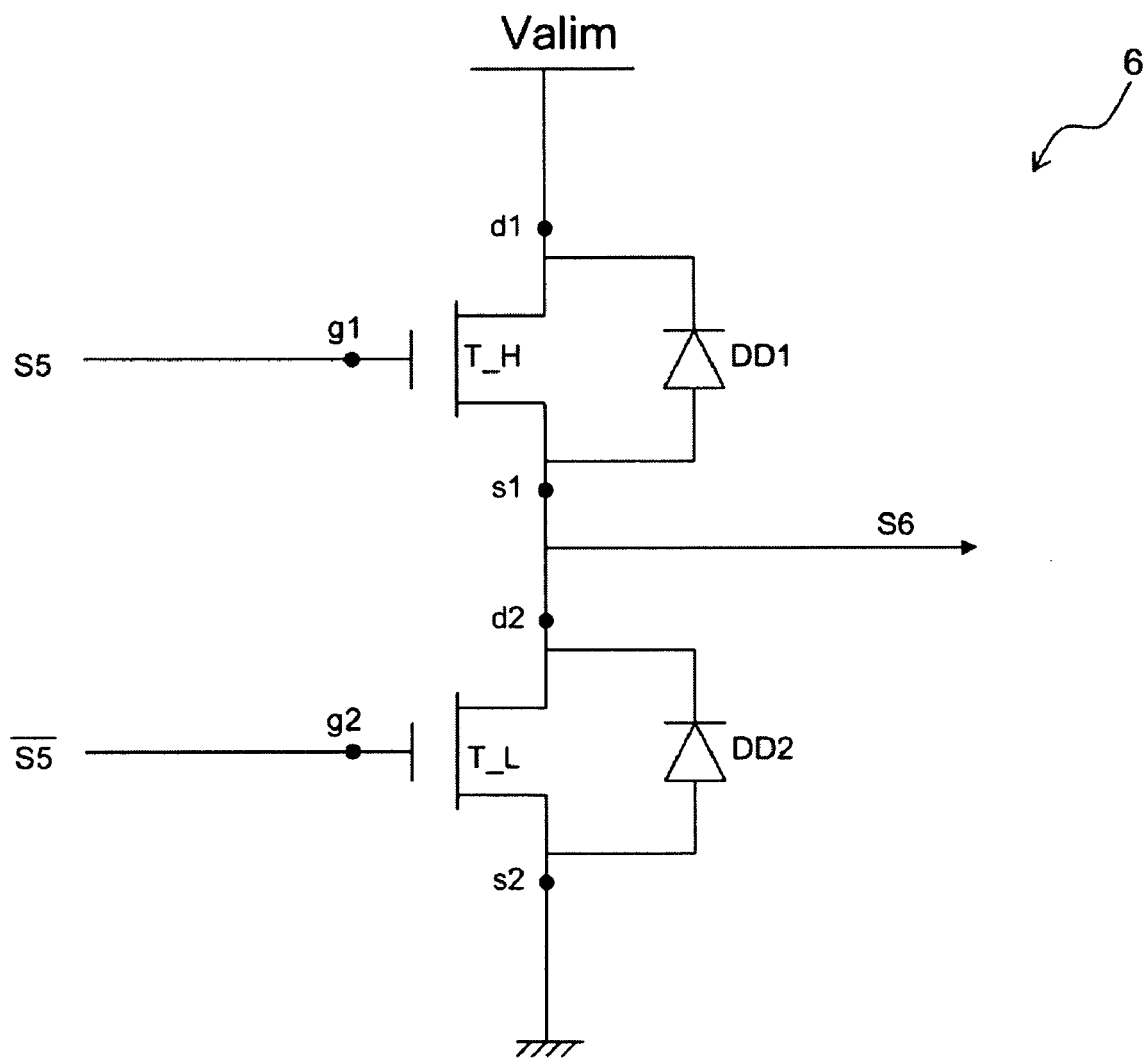
FIG. 6 schematically shows an example of an audio amplifier usable in the amplification circuit.

In FIG. 6 is shown an example of an embodiment of the audio amplifier 6 (for example, of the conventional type) having a high transistor T_H and a low transistor T_L implemented, for example, with N channel MOSFET (Metal Oxide Semiconductor Field Effect Transistor). The high transistor T_H is provided with a first gate terminal g1 connected to the input terminal of the audio amplifier 6 for receiving the first pre-charging signal S5, a first source terminal s1 connected to the output terminal of the audio amplifier 6 and a first drain terminal d1 connected to the supply voltage V_alim. The low transistor T_L is provided with a second gate terminal g2 connected to the inverted input terminal of the audio amplifier 6 for receiving the first inverted pre-charging signal S5, a second drain terminal d2 connected to the first source terminal s1, and a second source terminal s2 connected to the ground terminal.

The above-shown audio amplifier 6 is, according to this example, of half-bridge type, but the present disclosure can be applied also to different audio amplifier types. The high T_H and low T_L transistor are protected against the overvoltage by relative diodes DD1 and DD2 connected between the respective drain and source terminals (diodes DD1 and DD2 can be external or internal in respect to the high T_H and low T_L transistors). When the first gate terminal g1 receives the high level of the pulses of the first pre-charging signal S5 and the second gate terminal g2 receives the low level of the pulses of the first pre-charging signal, the high transistor T_H is activated whereas the low transistor T_L is inactive.

In this situation, the first source terminal S1 is at a potential substantially equal to the supply voltage V_alim. When the first gate terminal g1 receives the low level of the pulses of the first pre-charging signal S5 and the second gate terminal g2 receives the high level of the pulses of the pre-charging signal S5, the high transistor T_H is inactive whereas the low transistor T_L is active: under this further condition, the second drain terminal d2 will be connected to ground.

Figure 5:
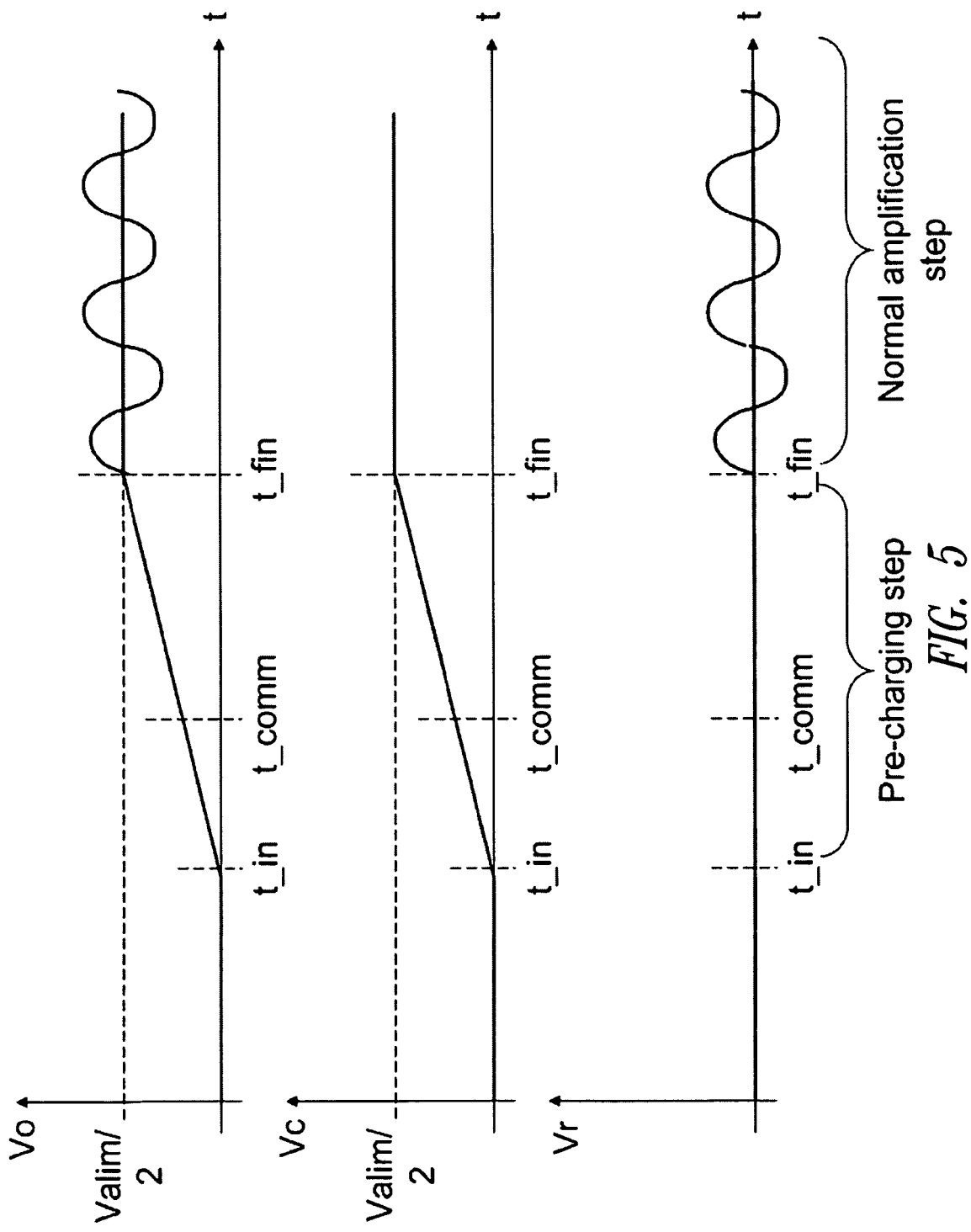
FIG. 5 schematically shows the pattern of some signals of the amplification circuit.

The low-pass filter 7 includes an input terminal for receiving the amplified signal S6 and has an output terminal for providing a filtered signal S7. In particular, the voltage value on the output terminal of the low-pass filer 7 is indicated in FIG. 1 with Vo and FIG. 5 shows that the pattern of voltage Vo at the output terminal of the low-pass filter 7 is substantially linearly increasing from a substantially zero value to an working value that is equal to half of the supply voltage (V_alim/2) in the time interval (between the instants t_in and t_fin) required for pre-charging the capacitor, as will be further explained below.

Figure 7:
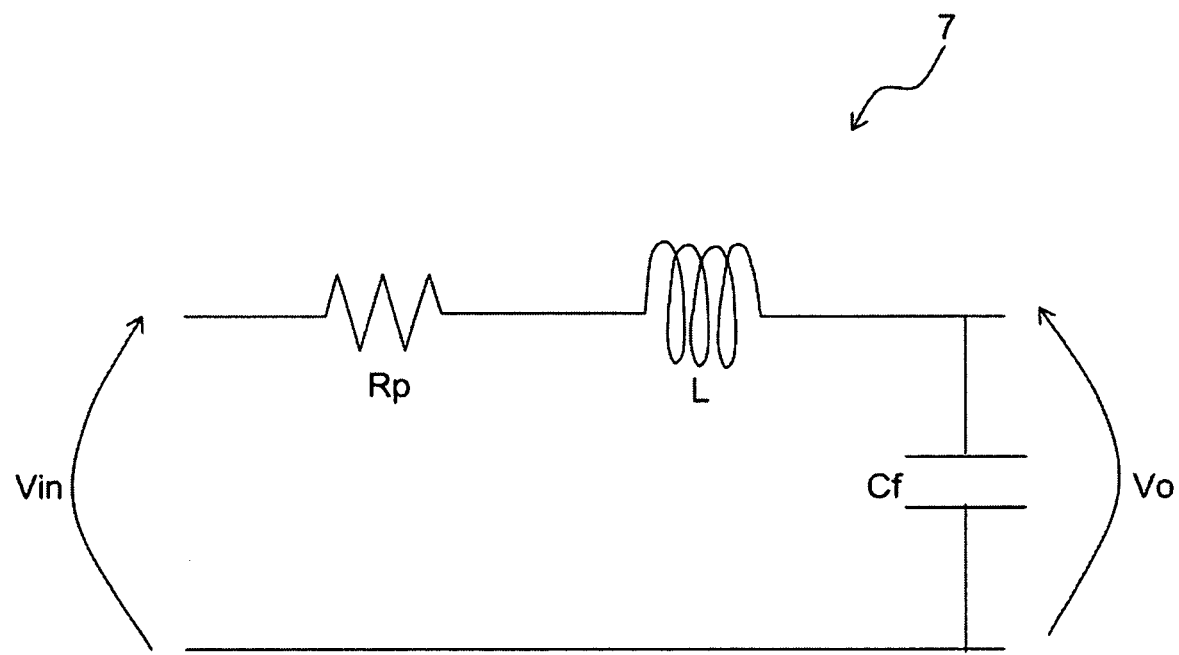
FIG. 7 schematically shows an example of a low-pass filter usable in the amplification system.

Preferably, the low-pass filter 7 is implemented as shown in FIG. 7 and it includes a parasitic resistor Rp, an inductor L with a terminal connected in series to the parasitic resistor Rp and a capacitor Cf connected between the other terminal of the inductor L and ground. The function of this low-pass filter is to filter the high frequency components generated by the abrupt changes in the pulses of the amplified signal S6, implementing, thereby, an average of the amplified signal S6 in the audio band.

The decoupling capacitor C is connected between the output terminal of the low-pass filter 7 and a terminal of the diffuser R. In particular, the value of the voltage drop at the capacitor C is indicated with Vc in FIG. 1 and FIG. 5 shows that the pattern of the voltage drop Vc at the capacitor C is substantially linearly increasing from the substantially zero value to a value equal to half of the supply voltage (V_alim/2) in the time interval (comprised between the instants t_in and t_fin) required for pre-charging the capacitor.

The diffuser R such as, for example, a loudspeaker, headphones, or earphones, is connected between the capacitor C and the ground. In particular, the value of the voltage drop at the diffuser R is indicated with Vr in FIG. 1 and FIG. 5 shows that the pattern of the voltage drop Vr at the diffuser R is substantially zero in the time interval (between the instants t_in and t_fin) required for pre-charging the capacitor.

Now, the operation of the audio amplification system 200 in the pre-charging step of the decoupling capacitor C will be described, by referring to FIGS. 3, 4, and 5. During this pre-charging step, the filtered signal S7 will be indicated, for sake of clarity, by the term "second precharging signal S7." At the instant t_in, the audio amplification system 200 is activated. The controller 2 detects the activation of the audio amplification system 200 and drives the selection input Sel in such a way that the density modulated pulse signal S3 is selected and transmitted as output to the selector 5 (in the example in FIG. 1 the controller 2 assigns the logic value '0' to the selection signal Sel).

In the same instant t_in, the ramp generator 1 generates at its own output the ramp signal S1 having a starting value V_in, as shown in FIG. 3. The density modulator 4 receives at the instant t_in the ramp signal S1 having the starting value V_in and generates therefrom, at the output terminal, a density modulated pulse signal S3 (which is the first pre-charging signal S5 in the pre-charging step between t_in and t_comm) including a first pulse having a width T_min, as shown in FIG. 4. For example, T_min is a value between 40 ns and 160 ns.

The audio amplifier 6 receives at the input the first pre-charging signal S5 including the first pulse and provides therefrom, at the output, the amplified signal S6 having a first amplified pulse.

The low-pass filter 7 receives the first amplified pulse of the amplified signal S6 and generates therefrom, at the output terminal, the second pre-charging signal S7, which starts to charge the decoupling capacitor with a substantially linearly increasing voltage signal Vo starting from a substantially zero value. However, the linearly increasing pattern of the voltage Vo (corresponding to the second pre-charging signal S7) is not essential, i.e., it is possible to have a stepwise increasing pattern according to other kinds of curves (for example, a polynomial curve with a grade greater than the first or an exponential curve) in the time interval (between the instants t_in and t_fin) wherein the pre-charge of the decoupling capacitor C occurs.

At the instant t_in the value of the voltage Vo at the low-pass filter 7 output is substantially zero and then also the value of the voltage drop Vc at the capacitor is substantially zero. Accordingly, at the instant t_in also the value of the voltage drop Vr at the diffuser is substantially zero, i.e., the voltage drop Vr at the diffuser is prevented from having an abrupt change upon activation of the audio amplification system 200 (which would result in a pop noise).

The value of the starting voltage V_in of the ramp signal S1 is chosen to be such that the density modulated signal S3 (and then the first pre-charging signal S5) is not generated having a too great distance T_max between the two subsequent pulses. In fact, in this case, the audio amplifier 6 is such that it can receive the first density modulated pulse pre-charging signal S5 and provide therefrom, on the output terminal, an amplified pulse signal S6.

The low-pass filter is such that it receives this amplified pulse signal S6 and provides therefrom the second pre-charging signal S7 having frequencies in the audio band, which would result in pop noise. For example, in case of an audio signal having a band not greater than 20 Khz, the distance T_max between two subsequent pulses of the density modulated signal cannot be greater than 1/20 Khz=50 μs.

Preferably, the pulses of the pulse density modulated signal S3 have a low value equal to 0 and a high value equal to 1, the width T_min of the pulses is 160 ns and the ramp generator 1 is implemented with a digital counter, such that a 16 bit quantized sample sequence can be generated, with values comprised between −1 and 1. It is defined the average value of the density modulated signal S3 as the ratio between the high width of the pulses (of density modulated signal S3) in a certain time interval divided by such time period.

If it is considered as a time interval to calculate the average value the interval of the distance T_max between two subsequent pulses, the average value (of the density modulated signal S3) is T_min/T_max=160 ns/50 μs=0.0032. Because pulses (of density modulated signal S3) have values equal to 0 or 1 and thus the average value (of density modulated signal S3) is in the range of 0 and 1, a scaling factor 2*x−1 to obtain a sample value from an average value x of density modulated signal S3 is required.

In the above events related to a starting instant t_in, the average value of the density modulated signal S3 is 0.0032, from which the starting value V_in of the twos complement logic 16 bit-coded ramp signal S1 is derived, is V_in= (2*0.0032−1)*2^15+2^16=32977.7152, which can be approximated to V_in=32978.

Afterwards, at instant t_in, the ramp generator 1 generates at the output the ramp signal S1 having a pattern linearly increasing from the starting value V_in to the switching value V_comm in the time interval between the instants t_in and t_comm, as shown in FIG. 3. In the same time interval between the instants t_in and t_comm, the density modulator 4 receives the ramp signal S1 having a pattern linearly increasing from the starting value V_in to the switching value V_comm and, as a function of this, generates the density modulated signal S3 (and therefore the first pre-charging signal S5) including subsequent pulses having an increasing density. For the sake of simplicity, FIG. 4 shows that the first pre-charging signal S5 includes two further pulses in the interval between the instants t_in and t_comm, wherein the distance between subsequent pulses is reduced (i.e., the pulses are denser).

As shown in FIG. 5, in the time interval comprised between the instants t_in and t_comm, the value of voltage Vo at the output of low-pass filter 7 has a substantially linearly increasing pattern and therefore also the value of the voltage drop Vc at the capacitor C has a substantially linearly increasing pattern. Accordingly, in the time interval between the instants t_in and t_comm, the value of the voltage drop Vr at the diffuser R is substantially zero, thus reducing the pop noise.

At the switching instant t_comm the controller 2 detects that the value of the ramp signal S1 is equal to a switching value V_comm and drives the selection input Sel, such that the pulse width modulated signal S2 is selected and transmitted to the output of the selector 5. (In the example in FIG. 1 the controller 2 assigns the logic value "1" to the selection signal Sel.)

The width modulator 3 receives at the instant t_comm the ramp signal S1 having the switching value V_comm and generates therefrom, at the output terminal, the pulse width modulated signal S2 (which is the first pre-charging signal S5 in the pre-charging step between t_comm and t_fin) having a pulse with a width at least equal to T_min of density modulated pulse signal. Advantageously, the pulse width at instant t_comm (of the pulse width modulated signal S2) is equal to the width of the previous pulses (of density modulated signal S3), in order to have the minimum discontinuity when switching from the density modulated signal S3 to the pulse width modulated signal S2.

In the case of an audio amplification system 200, the switching value V_comm is calculated as follows: Typically the pulse width modulated signal S2 has a pre-fixed frequency value equal to f_smd=384 Khz, corresponding to a period of T_smd=1/384 Khz=2.6 μs. By using the same hypothesis referred to herein for the calculation of the starting value V_in (that is the pulse width modulated signal S2 has a low value 0 and a high value 1, the ramp generator 1 is implemented with a digital counter such that it generates a 16 bit quantized sample sequence with values comprised between −1 and 1, the minimum width T_min of the pulses is 160 ns), the average value of the pulse width modulated signal S2 is T_min/T_smd=160 ns/2.6 μs=0.06144, from which it is derived that the switching value V_comm of the twos complement logic 16 bit coded ramp signal 1 is V_comm=(2*0.06144−1) *2^15+2^16=36794.53184, which can be approximated to V_comm=36794.

After the instant t_comm, the ramp generator 1 generates, at the output terminal, the ramp signal s1 having a pattern linearly increasing from the switching value V_comm to the final value V_fin in the time interval between the instants t_comm and t_fin, as shown in FIG. 3. In the same time interval, the width modulator 3 receives the ramp signal S1 having a pattern linearly increasing from the switching value V_comm to the final value V_fin. As a function of this, the width modulator 3 generates the pulse width modulated signal S2 (and therefore the first pre-charging signal S5) having subsequent pulses with an increasing width. For the sake of simplicity, FIG. 4 shows four pulses in the interval between the instants t_comm and t_fin, where the pulse width between subsequent pulses increases.

As shown in FIG. 5, in the time interval between the instants t_comm and t_fin, the value of voltage Vo at the output of low-pass filter 7 has a pattern substantially linearly increasing to a value that is equal to half of the supply voltage V_alim/2. Also, the value of the voltage drop Vc at the capacitor C has a pattern substantially linearly increasing to a value, which is equal to half of the supply voltage V_alim/2. Accordingly, in the time interval between instants t_comm and t_fin, the value of the voltage drop Vr at the diffuser R is substantially zero, thus reducing the pop noise.

At the instant t_fin, the controller 2 detects and determines that the value of the ramp signal S1 is equal to a final value V_fin, indicating the end of the capacitor pre-charging step. Subsequently, the ramp generator 1 generates a ramp signal S1 having a constant value equal to the final value V_fin.

The final value V_fin is chosen to be such that the capacitor (at the end of the pre-charging step) is charged at the working value (for example, the voltage drop VC at the capacitor is equal to half the supply voltage V_alim/2), such that at the end of the pre-charging step the value of the bias voltage drop Vr at the diffuser R is zero.

In the example shown in FIG. 5, this is obtained by using a square wave pulse width modulated signal S2 (and thus S5) having at the final instant t_fin of the pre-charging step a high value for half of the period T_smd of the pulse width modulated signal S2 (and S5), where it is shown that the duty cycle of the pulse width modulated signal S2 (and S5) is equal to 50%. Accordingly, pulses of the square wave amplified signal S6 are used at the final instant t_fin of the pre-charging step having a low value, which is equal to a zero voltage and a high value, which is equal to the supply voltage V_alim of the audio amplification system 200. Wherein, at the final instant t_fin of the pre-charging step, the pulses of the amplified signal S6 have a 50% duty cycle in such a way that the average value of the voltage Vo at the low-pass filter 7 output is half the supply voltage V_alim/2, the average value of voltage drop Vc at the capacitor is equal to half of the supply voltage V_alim/2, and the average value of the bias voltage drop Vr at the diffuser R is zero.

Therefore, the first pre-charging signal S5 used for driving the audio amplifier 6 input during the decoupling capacitor pre-charging step includes a first step (referred to in FIG. 4 as "Density Modulation") comprised between instants t_in and t_comm, wherein the first density-modulated pulse pre-charging signal S5 and includes subsequently a step (referred in FIG. 4 as "Width Modulation") comprised between the instants t_comm and t_fin, wherein the first pulse width modulated pre-charging signal S5 is generated.

It is to be noted that the pattern of the signal of the voltage drop Vr at the diffuser R is substantially zero during all the pre-charging step of the capacitor C, i.e., the dynamic of the signal of the voltage drop at the diffuser R is prevented from being high, which would result in pop noise.

Preferably, the amplification circuit 100 is in class D. In this case, the first width-modulated pulse pre-charging signal S5 can be used to directly drive (possibly inverted) the audio amplifier 6, as shown in FIG. 1. On the contrary, means are required to convert the first pulse pre-charging signal S5 in a proper signal to drive the audio amplifier 6.

The amplification circuit 100 has the advantage that it allows a pre-charging step (between t_in and t_in) of the capacitor (for example, 100 ms in case of an amplification system) shorter than the prior art, because it uses the same audio amplifier 6 to charge the decoupling capacitor C and because, advantageously, the audio amplifier 6 is capable of supplying a high current. Moreover, the pop noise is reduced due to the decoupling capacitor C being charged stepwise during the pre-charging step and thus peaks of the voltage drop at the diffuser R are (partially or fully) reduced.

It is to be noted that, during the pre-charging step, using the density modulator 4 in the interval between the starting instant t_in and the switching instant t_comm is particularly advantageous, as it allows to obtain starting pulses of the first pre-charging signal S5 having an average value sufficiently near 0, whereas such pulses are not obtainable by the width modulator 3. Thereby a voltage Vo at the output of the low-pass filter 7 can be obtained, having a substantially zero value at the starting instant t_in and having starting values slightly greater than 0 and stepwise increasing.

At the instant t_fin the pre-charging step of the capacitor C has ended and the normal operation of the audio amplifier 6 can be activated in order to amplify a usable audio signal, which is shown in FIG. 5 as "Normal amplification step," and it is subsequent in respect to the instant t_fin.

The operation of the normal amplification step of a usable audio signal will now be described, which is subsequent to the pre-charging step of capacitor C.

The oversampling module 11 receives a usable pulse code modulated audio digital signal Sa (N-bit quantized) and provides an oversampled signal S10 (N-bit quantized).

The interpolator module 12 receives the oversampled signal S10 and provides therefrom an interpolated signal (not shown in FIG. 1) by carrying out the interpolation between two subsequent samples of the oversampled signal S10, and calculated (based on known methods) the intersection between the interpolated signal and a first saw tooth modulating signal having the same frequency as the pulse width modulated signal S2. This computing is graphically shown in the upper part of FIG. 8, wherein the interpolated signal is shown as a thick solid line, the first saw tooth modulating signal is indicated with M1 and the intersections between the interpolated signal and the first saw tooth modulating signal are indicated with I1 and I11. The interpolator 12 provides, at the output terminal, a first (N-bit quantized) sample sequence S11 wherein the values of samples are the time instants t1, t11 calculated from the intersections I1, I11 and the time instants t1, t11 will be used by the width modulator 3 in order to generate the width modulated signal S2, as will further explained below. Preferably, the interpolation is linear.

The noise shaping module 15 receives the first N-bit quantized sample sequence S11 and provides therefrom, at its output terminal, a second sample sequence S12 quantized with a number of bits M, which is smaller than N. Wherein the noise is partially moved outside the audio signal band (such that the noise can the be removed by the subsequent low-pass filter 7).

The width modulator 3 receives the second sample sequence S12 and generates therefrom a second pulse width modulated digital audio signal S2, at the output terminal, as a function of the sample values of the second sequence S12. In particular, the sequence samples S12 are used to determine the instants when the switching of the pulse width modulated audio signal S2 pulses is to be carried out, as will be further explained below.

The pulse width modulated audio signal S2 is thus transmitted at the output terminal of the selector 5 and it is received by the audio amplifier 6, which generates an amplified pulse width modulated audio signal S6.

The low-pass filter 7 receives the amplified pulse width modulated audio signal S6 and generates the filtered audio signal S7. FIG. 5 shows the pattern of the voltage signal Vo (corresponding to the filtered audio signal S7) during the normal amplification step, where, for sake of simplicity, is indicated a sinusoid centered on the biasing value V_alim/2 and which represents a spectral component (in the audio band between 0 and 20 Khz) of the filtered audio signal S7. The filtered audio signal S7 is in actuality the overlap of different spectral components and therefore it can have a different time pattern.

Then, the audio signal S8 is generated after the capacitor C and the audio signal S8 is used to drive the diffuser R. FIG. 5 shows that the pattern of the value of the voltage drop Vc at the capacitor C during the normal amplification step is substantially constant, and it is equal to half of the supply voltage V_alim/2. FIG. 5 also shows the pattern of the value of the voltage drop Vr (corresponding to the audio signal S8 after the capacitor C) at the diffuser during the normal amplification step where, again, only a sinusoid, centered on the zero value, is indicated.

Preferably, the oversampled audio signal S10 has a sampling frequency greater than the frequency of the pulse width modulated signal S2. For example, an audio amplification system 200 is such that it receives a pulse code modulated audio digital signal Sa with a sampling frequency of 48 Khz (where the samples are 16 or 24 bit quantized) and the pulse width modulated digital audio signal S2 has a frequency of 384 Khz. The oversampled audio signal S10 has a sampling frequency of 1.5 Mhz (i.e., an oversampling by a factor of 32 is carried out), which is greater than the 384 Khz frequency of the pulse width modulated digital audio signal S2.

The advantage of carrying out the oversampling (at a frequency greater than the frequency of the signal generated by the width modulator 3) and the interpolation is that the distortion introduced by the conversion process of the pulse code modulated digital audio signal Sa into a pulse width modulated signal S2 is minimized, as the intersections between the interpolated signal and the first (or a second) saw tooth modulating signal are calculated more finely.

Preferably, the width modulator 3 is implemented with an M-bit digital counter (which operates with a clock identical to f_smd*2^M, where f_smd is the pulse width modulated signal S2 frequency) and a digital comparator. The width modulator 3 receives the second M-bit quantized sample sequence S12 and determines therefrom the instants wherein the pulse switching of the pulse width modulated signal S2 is to be carried out. The digital counter generates a value increasing from zero to the maximum value at M bit. The digital comparator receives at the input the M-bit quantized samples S12 and the value generated by the digital counter, carries out the comparison between the inputs and controls the pulse switching of the pulse width modulated signal S2.

Preferably, the interpolator module 12 calculates the intersection between the interpolated signal and a second saw tooth modulating signal having the same frequency as the pulse width modulated signal S2 frequency (therefore the same as the first saw tooth modulating signal M1 frequency), where the pattern of the saw tooth of the first modulating signal M1 is phased but opposite that of the second modulating signal (for example, increasing for the first signal and decreasing for the second, or vice versa). This is shown in the upper part of FIG. 8, wherein the interpolated signal is indicated with a thick solid line, the second saw tooth modulating signal is indicated with M2, and the intersections between the interpolated signal and the second saw tooth modulating signal are indicated with I2 and I12.

Two intersections for each period of the first (or the second) saw tooth modulating signal M1 (or M2) are obtained. This has the advantage that the width modulator 3 generates a finer pulse width modulated signal S2 because it uses two samples for each period.

Preferably, the interpolator module 12 provides the first quantized sample sequence S11 and also provides a third quantized sample sequence S13 (not shown in FIG. 1) indicating the time instants of another pulse width modulated signal S15 (not shown in FIG. 1), where the first sequence S11 is calculated from the intersection I1, I11 between the interpolated signal and the first saw tooth modulating signal M1 and the third sequence S13 is calculated from the intersections I2, I12 between the interpolated signal and the second saw tooth modulating signal M2. In this case, the noise shaper 15 receives the first sequence S11 and the third sequence S13 and provides therefrom the second sequence S12 and the fourth sequence S14, respectively. Therefore also the fourth quantized samples sequence S14 is indicating the time instants of the other pulse width modulated signal S5.

The width modulator 3 receives the second sequence S12 and the fourth sequence S14 and generates therefrom the pulse width modulated signal S2 and the other pulse width modulated signal S15, as will be explained in detail below in the type 3 ternary modulation scheme. During the normal operation step of the amplification system, the selector 5 receives the pulse width modulated signal S2 and the other pulse width modulated signal S15 and transmits them at the output terminal.

Figure 8:
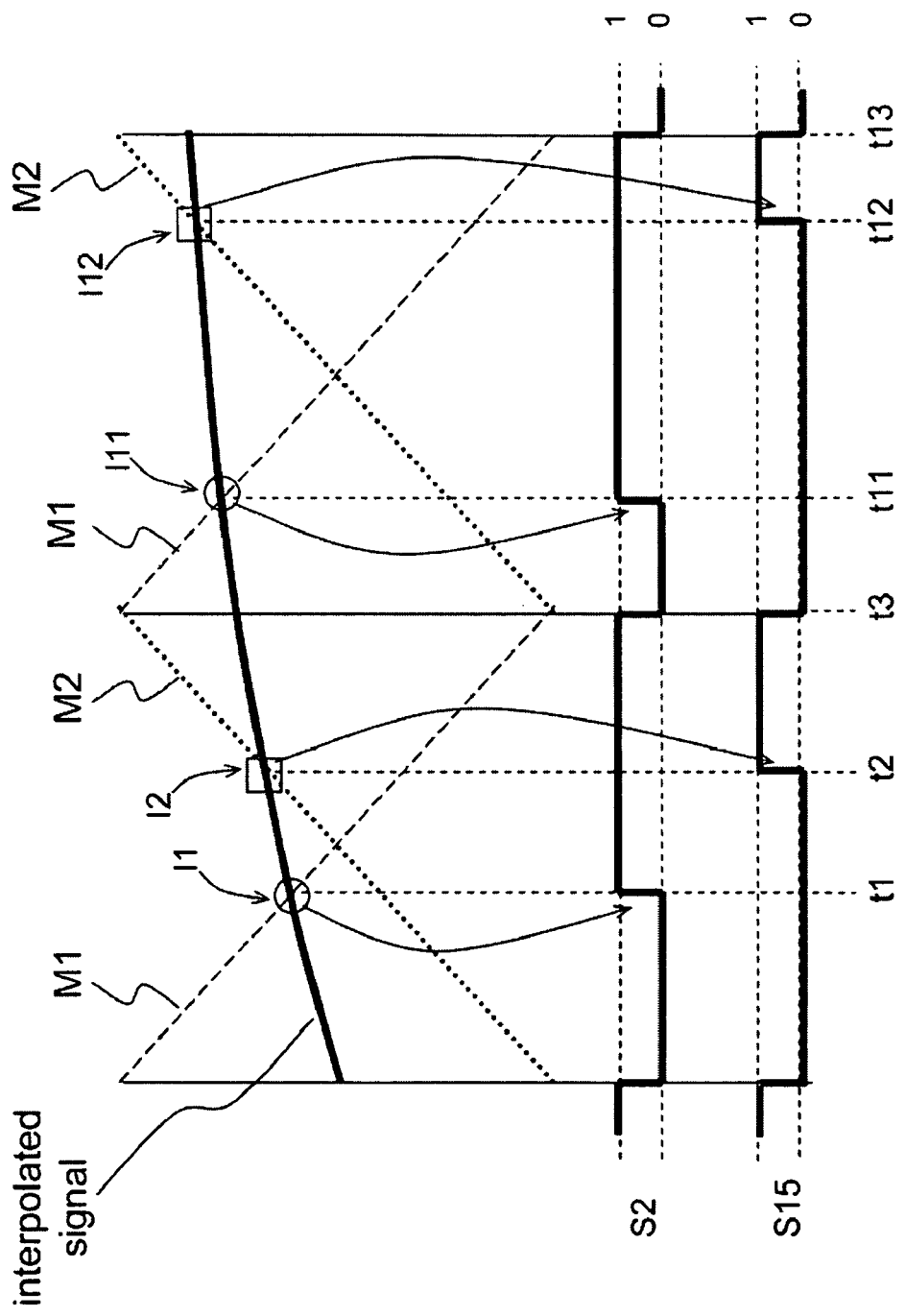
FIG. 8 schematically shows a type 3 ternary modulation.

The lower part of FIG. 8 shows the type 3 ternary modulation, wherein the width modulator 3 generates the pulse width modulated signal S2 and the pulse width modulated signal S15 using the time instants calculated from both intersections of each period of the saw tooth modulating signals M1 and M2. In particular:

the width modulator 3 receives the second sequence S12, carries out the pulse switching (for example of the rising edge of the pulse) of the pulse width modulated signal S2 at time instants (in the example shown in FIG. 8, the instants t1 and t11) corresponding to sample values in the second sequence S12 and carries out the opposite switching of the pulse (in the example, the switching of the falling edge of the pulse) at the end of a period (in the example, the instants t3 and t13, respectively) of the pulse width modulated signal S2;

the width modulator 3 receives the fourth sequence S14 and carries out the switching of the pulse (for example, the switching of the rising edge of the pulse) of the other pulse width modulated signal S15 at time instants (in the example, the instants t2 and t12) corresponding to sample values in the fourth sequence S14 and carries out the opposite switching of the pulse (in the example, the switching of the falling edge of the pulse) at the end of a period (in the example, the instants t3 and t13, respectively) of the pulse width modulated signal S15.

An advantage of the type 3 ternary modulation is that each of the pulse width modulated signals S2 and S15 is a binary type modulated signal and thus each of them can be used to drive a terminal of the diffuser (while the other terminal is connected to ground). Further, the two pulse width modulated signals S2 and S15 can be used to drive a full bridge audio amplifier 6 in a differential mode.

A further advantage of the type 3 ternary modulation is that it can be used to drive three-terminal diffusers (e.g., headphones) indicated as left, right and common. This is achieved by driving the left terminal with the pulse width modulated signal S2, by driving the right terminal with the pulse width modulated signal S15, and by driving the common terminal with a pulse signal having a constant duty cycle equal to 50%.

It is to be observed that the type 3 ternary modulation is an embodiment itself, regardless of the other aspects described above such as, for example, those related to the pre-charge step.

The type 3 ternary modulation allows the pulse width modulated signals S2 and S15 to be time-phase shifted with respect to each other and a variant is thereby obtained, indicated below as "phase shifted type 3 ternary modulation". This variant has the advantage of reducing the noise generated by the close switchings (in the same period, for example instant t2 of FIG. 8 is close to instant t1) and in the same direction of the two pulse width modulated signals S2 and S15 (for example, both switchings are a rising edge), where the switchings occur at time instants calculated from the intersections of the saw tooth modulating signals M1, M2 with the interpolated signal having values near zero.

In particular, the phase shifted type 3 ternary modulation is achieved by time phase shifting, by a determined time interval, one of the two saw tooth modulating signals in respect to each other, e.g., by phase shifting the saw tooth modulating signal M2 in respect to the saw tooth modulating signal M1. In this manner, instants when the switching of pulse width modulated signals S2 and S15 occur can be further separated, and this is particularly advantageous when the interpolated signal has values close to zero. When simultaneous switchings are present, still present upon increasing the interpolated signal width, these are, however, prevented by artificially spacing the contemporary edges and compensating the error introduced by the noise shaper 15 in the period subsequent to the time wherein the error is introduced.

Preferably, the intersections between the linearly interpolated signal and the first (or the second) saw tooth modulating signal M1 are calculated by using the first three development terms in Taylor series. In particular, the linearly interpolated signal is represented by a straight line in plane (x, y) which passes through two known points (x1, y1) (x2, y2) and the first modulating signal M1 is represented by a straight line y=−x. A linear system is obtained of 2 equations in the unknowns (x, y).

If K=1/(x2−x1) and D=K*(y2−y1), the following system solution is obtained: x=(D*x1−y1)/(1+D). This solution would require to implement a division, which has a high computational cost. However, the computational cost can be reduced because the term D is much smaller than 1 and therefore the following development in Taylor series can be used: $1/(1+D)=1-D+D^2-D^3+\ldots$. Considering the first three terms of the development in series, the following approximated solution is obtained:

$$x = -y1 + (y1+x1)*D - (y1+x1)*D^2 + (y1+x1)+D^3.$$

The approximated solution no longer includes the division, but it includes the multiplications. This has the advantage of remarkably reducing the computational cost.

Preferably, the low-pass filter 7 is implemented as shown in FIG. 7. In particular, the low-pass filter is sized taking into account the parasitic resistor Rp, which is an intrinsic resistor that has, as main contributions, the series resistance of the inductor L and the parasitic resistors of the output transistors of the audio amplifier 6.

The inductance value and the capacitance of the inductor L and of the capacitor Cf, respectively, used in the low-pass filter 7 are calculated, where L indicates again the inductance value, and Cf indicates the capacitance value and R indicates the value of the resistance of the diffuser. For sake of simplicity, the decoupling capacitor C is ignored (as its capacitance value is high and the capacitor can be considered as a short-circuit at the audio frequencies), and thus the output terminal of the low-pass filter 7 is directly connected to the diffuser R.

A search can be done for a two complex conjugated pole transfer function Vr/Vin(s) (i.e., in the s domain of the Laplace transform), with the denominator being $s^2+(\omega_0/Q)*s+\omega_0^2$, wherein $\omega_0$ is the cut-off pulsatance and Q is the quality factor.

The transfer function Vr/Vin(s) in the s domain of the Laplace transform is the following:

$$\frac{Vr}{Vin}(s) = \frac{R}{L*R*Cf*s^2 + (L+Rp*R*Cf)*s + (R+Rp)} =$$

$$= \frac{\frac{1}{L*Cf}}{s^2 + \frac{L+Rp*R*Cf}{L*R*Cf}*s + \frac{R+Rp}{L*R*Cf}}$$

It is assigned the equality:

$$\frac{\omega_o}{Q} = \frac{L+Rp*R*Cf}{L*R*Cf}$$

$$\omega_o^2 = \frac{R+Rp}{L*R*Cf}$$

and a second grade system is obtained, wherein the unknowns are the inductance L and the capacitance Cf.

The following solution of the inductance L is obtained:

$$L = \frac{R+Rp}{2*Q*\omega_0} \pm \sqrt{\frac{(R+Rp)^2}{4Q^2*\omega_0^2} - \frac{Rp*(R+Rp)}{\omega_0^2}} =$$

$$\frac{R+Rp}{2*Q*\omega_0} \pm \frac{R+Rp}{2*Q*\omega_0}\sqrt{1 - \frac{4*Q^2*Rp}{R+Rp}} =$$

$$\frac{R+Rp}{2*Q*\omega_0}\left(1 \pm \sqrt{1 - \frac{4*Q^2*Rp}{R+Rp}}\right)$$

wherein Q is the quality factor and $\omega_0$ is the cut-off pulsatance or frequency of the low-pass filter 7.

In the case of an amplification system of audio signals, the value of R is comprised between 4Ω and 32Ω, and a typical value of Rp is 0.4Ω, thus R is much greater than Rp. In this case the term $$\frac{4*Q^2*Rp}{R+Rp}$$

is much smaller than 1 and the following approximation can be used:

$$\sqrt{1+x} \cong 1 + \frac{x}{2} \text{ for } x \ll 1$$

Therefore it is obtained:

$$L \cong \frac{R+Rp}{2*Q*\omega_0}\left(1 \pm \left(1 - \frac{2*Q^2*Rp}{R+Rp}\right)\right)$$

from which the following two values of inductance L are obtained:

$$\begin{cases} L = \frac{R+(1-Q^2)*Rp}{Q*\omega_0} \\ L = \frac{Q*Rp}{\omega_0} \end{cases}$$

The first value of inductance L depends on the value R of the resistance of the diffuser, whereas the second value of inductance L does not depend on the value R of the resistance of the diffuser. In particular, when the value of Rp is about 0, the first value of inductance L becomes the known solution $R/(Q*\omega_0)$.

On the contrary, if the second value of inductance L is chosen, supposing R≫Rp, the following value of capacitance Cf is derived:

$$Cf \cong \frac{1}{Q*\omega_0*Rp}$$

The following values of the inductance L and of the capacitance Cf of the low-pass filter 7 are obtained:

$$\begin{cases} L = \dfrac{Q * RP}{\omega_0} \\ Cf = \dfrac{1}{Q * \omega_0 * Rp} \end{cases}$$

It is to be noted that the chosen solution provides values of the inductance L and of the capacitance Cf that are not dependent on the value of the resistance R of the diffuser, but instead depend on the value of the parasitic resistor Rp (which depends on the type of audio amplifier 6). This has the advantage that the low-pass filter 7 is sized in order not to be dependent on the value R of the resistor (but only on the parasitic resistor Rp which can be measured), i.e., that the low-pass filter 7 has no need to be replaced in case the diffuser R is replaced. It is to be noted that the solution related to the sizing of the low-pass filter 7 is an embodiment itself, regardless the other aspects described above, such as, for example, those related to the pre-charging step.

A further advantage is that the second chosen value of the inductance L is smaller than the first value. Thereby, the dimensions of the inductor are smaller and therefore the series resistance is smaller, thus increasing the efficiency of the power transferred from the audio amplifier 6 to the diffuser R. For example, in case of an audio amplifier for audio signals, the audio amplifier 6 is driven by a pulse width modulated signal having a frequency of 384 Khz. If the low-pass filter 7 is required to have a flat band in the audio frequencies in the range of 0 and 20 Khz and an attenuation of 40 dB at the frequency of 384 Khz, the cut-off pulsatance or frequency $\omega_0 = 2\pi * 38$ Khz, and the quality factor Q=0.762 can be selected. This results in a value L=1.3 uH, which is smaller than the value L=22 uH obtained by selecting the first solution (in the case where the value of the resistance of the diffuser is R=4$\Omega$).

The low-pass filter 7 is also usable in the case of a differential full bridge amplifier topology.

Advantageously, the converter 300 and the audio amplification system 100 are implemented in the same integrated circuit.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An amplification circuit for driving a diffuser of an audio signal, the circuit comprising:
   a first generator circuit structured to generate a pulse density modulated signal;
   a second generator circuit structured to generate a pulse width modulated signal;
   an amplifier circuit having an input terminal structured to receive the pulse density modulation signal and the pulse width modulation signal, and an output terminal, the amplifier circuit structured to provide a pre-charging signal in response to the pulse density modulated signal and the pulse width modulated signal; and
   a decoupling capacitor structured to be coupled to the diffuser and to the output terminal of the amplifier circuit and structured to receive the pre-charging signal.

2. The circuit of claim 1, further comprising:
   a selector coupled between the first and second generator circuits and the amplifier circuit and structured to select between the pulse density modulated signal and the pulse width modulated signal as an output of the selector, the selector adapted to select first the pulse density modulated signal and then the pulse width modulated signal.

3. The circuit of claim 2, further comprising a ramp signal generator coupled to the first and second generator circuits and structured to output a ramp signal having a pattern of an increasing value from a starting value to a final value within a pre-charging time interval.

4. The circuit of claim 3, further comprising a controller coupled to the selector and structured to control switching of the selector from the pulse density modulated signal to the pulse width modulated signal when the value of the ramp signal is equal to a switching value, and
   the first generator and the second generator circuits are adapted to generate the pulse density modulated signal and the pulse width modulated signal, respectively, as a function of the ramp signal.

5. The circuit of claim 4, wherein the amplifier circuit is adapted to provide the pre-charging signal with a substantially stepwise pattern increasing from a substantially zero value to a working value within the pre-charging time interval.

6. The circuit of claim 5, wherein the first generator circuit is structured to generate the pulse density modulated pulse signal with a corresponding pulse width and the second generator circuit is structured to generate the pulse width modulated signal with an associated frequency, and the switching value of the ramp signal is a function of said pulse width and of said frequency.

7. The circuit of claim 3, wherein the amplifier circuit is further adapted to receive an audio signal having a maximum frequency and wherein a starting value of the ramp signal is a function of the pulse width of the density modulated pulse signal and of a maximum frequency of the audio signal.

8. The circuit of claim 1, wherein the amplifier circuit is a class D amplifier.

9. The circuit of claim 1, wherein the amplifier circuit includes an amplifier stage provided with at least one transistor and a filtering stage.

10. The circuit of claim 9, wherein said amplifier stage includes a half-bridge having a first transistor and a second transistor that are configured to switch between an active and an inactive configuration as a function of the pre-charging signal.

11. The circuit of claim 9, wherein the filtering stage includes a low-pass filter coupled to the decoupling capacitor.

12. The circuit of claim 9, wherein the amplifier stage includes first and second transistors having a second resistance and the filtering stage comprises an inductor and a filtering capacitor, the inductor having a first resistance and having an inductance that is a function of the first and second resistances, the capacitor having a capacitance that is a second function of the first and second resistances, and the filtering stage structured to function independent of a resistance associated with the diffuser.

13. The circuit of claim 3, wherein the ramp signal generator includes a digital counter.

14. The circuit of claim 6, wherein the first generator circuit of the pulse density modulated signal is implemented with a noise shaper having a sampling equal to a period of the pulse width of the pulse density modulated signal.

15. The circuit of claim 4, wherein the ramp signal is a digital signal and wherein the second generator circuit of the pulse width modulated signal includes:
a digital counter structured to generate a counting signal having increasing values; and
a digital comparator structured to receive the digital ramp signal and the counting signal and to control switching of the pulses of the pulse width modulated signal when the value of the counting signal is equal to the value of the digital ramp signal.

16. The circuit of claim 1, wherein the decoupling capacitor is structured to be charged by the pre-charging signal to substantially a same value as half a supply voltage of the amplifier.

17. A system comprising:
a converter structured to receive a first pulse signal having a first modulation and to convert the first pulse signal into a second pulse signal having a second modulation;
an amplification circuit that includes:
a generation circuit structured to generate a pulse density modulation signal and a pulse width modulation signal to be used as a first pre-charging signal;
a selector circuit structured to select first the pulse density modulation signal as a first pre-charging signal and then the pulse width modulation signal as the first pre-charging signal; and
an amplifier having an input terminal to receive the first pre-charging signal and an output terminal to provide a second pre-charging signal, the amplifier structured to generate the second pre-charging signal as a function of the first pre-charging signal; and
a decoupling capacitor coupled to the amplifier and the diffuser and structured to decouple the amplifier from the diffuser, the decoupling capacitor coupled to the output terminal of the amplifier and structured to receive the second pre-charging signal, the amplification circuit structured to charge the decoupling capacitor in a pre-charging mode and is structured to provide an amplified signal from the second pre-charging signal in an amplification mode.

18. The amplification system of claim 17, wherein the first pulse signal is a pulse code modulated PCM signal and the second pulse signal is pulse width modulated PWM signal.

19. The amplification system of claim 18, wherein the converter comprises:
an oversampler structured to receive the pulse code modulated signal and to provide therefrom an oversampled pulse code modulated signal;
an interpolator structured to receive the oversampled pulse code modulated signal and to provide therefrom a first sequence of quantized values indicating time instants of the pulse width modulated signal; and
a noise shaper structured to receive the first sequence of quantized values and to provide therefrom a second sequence of quantized values with a smaller number of bits and with a smaller noise in the frequency band of the pulse code modulated signal.

20. The amplification system of claim 19, wherein the oversampler is configured to produce the oversampled pulse code modulated signal with a sampling frequency that is greater than a frequency of the pulse width modulated signal.

21. A circuit for amplifying an audio signal for use with an audio output device, the circuit comprising:
a decoupling capacitor configured to be coupled to the audio output device;
a generation circuit having an output terminal and a control circuit structured to generate a control signal and a selection circuit structured to receive the control signal and to generate on the output terminal a pulse density modulated signal and a pulse width modulated signal in an alternating sequence as determined by the control signal; and
an amplifier having an input coupled to the output of the generation circuit and structured to generate a pre-charge signal, wherein the decoupling capacitor is configured to control the audio output device.

22. The circuit of claim 21, wherein the generation circuit includes a ramp generator structured to generate a ramp signal and the generation circuit is structured to receive the ramp signal and in response thereto generate the pulse density modulated signal and the pulse width modulated signal.

23. The circuit of claim 21, further comprising a converter circuit coupled to the generation circuit, the converter circuit having a noise shaper circuit structured to provide a sequence of quantized values to the generation circuit.

24. A circuit, comprising:
a generator circuit having a control circuit structured to generate a control signal and a selector circuit coupled to the control circuit, the generator circuit adapted to produce a ramp signal that is used to generate on an output of the generator circuit a pulse density modulation signal and a pulse width modulation signal in an alternating sequence as determined by the selector circuit in response to the control signal from the control circuit;
a decoupling capacitor coupled to the generator circuit and adapted to receive the pulse density modulation signal and the pulse width modulation signal; and
an audio output device coupled to the decoupling capacitor.

25. The circuit of claim 24, further comprising an amplifier coupled between the generator circuit and the decoupling capacitor, the amplifier having an input coupled to the generator circuit to receive the pulse density modulation signal and the pulse width modulation signal and an output coupled to the decoupling capacitor.

26. The circuit of claim 25, further comprising a converter circuit coupled to the generator circuit, the converter circuit having a noise shaper circuit structured to provide a sequence of quantized values to the generator circuit.

* * * * *